United States Patent
Takahashi (10) Patent No.: US 7,291,559 B2
(45) Date of Patent: Nov. 6, 2007

(54) ETCHING METHOD, GATE ETCHING METHOD, AND METHOD OF MANUFACTURING SEMICONDUCTOR DEVICES

(75) Inventor: Akira Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 383 days.

(21) Appl. No.: 11/011,947

(22) Filed: Dec. 15, 2004

(65) Prior Publication Data

US 2005/0095870 A1  May 5, 2005

Related U.S. Application Data

(62) Division of application No. 10/364,356, filed on Feb. 12, 2003, now Pat. No. 6,849,556.

(30) Foreign Application Priority Data

Sep. 27, 2002 (JP) .............................. 2002-282155

(51) Int. Cl.
*H01L 21/302* (2006.01)
(52) U.S. Cl. ...................... 438/689; 438/694; 438/700; 438/704; 438/725; 216/70; 216/71; 216/72; 216/73
(58) Field of Classification Search ................ 438/689, 438/694, 700, 704, 706, 725; 216/70, 71, 216/72, 73; 257/E21.214, E21.453, E21.017
See application file for complete search history.

(56) References Cited

U.S. PATENT DOCUMENTS

| 4,732,871 | A | * | 3/1988 | Buchmann et al. ......... 438/183 |
|---|---|---|---|---|
| 5,746,928 | A | | 5/1998 | Yen et al. |
| 5,804,088 | A | | 9/1998 | McKee |
| 6,394,104 | B1 | * | 5/2002 | Chen et al. .................. 134/1.1 |
| 6,458,655 | B1 | * | 10/2002 | Yuzuriha et al. ............. 438/257 |
| 6,479,390 | B1 | * | 11/2002 | Lee .............................. 438/706 |
| 6,764,898 | B1 | * | 7/2004 | En et al. ...................... 438/240 |
| 6,849,556 | B2 | * | 2/2005 | Takahashi .................... 438/725 |
| 7,045,462 | B2 | * | 5/2006 | Sakai et al. .................. 438/689 |
| 7,087,532 | B2 | * | 8/2006 | Dobuzinsky et al. ........ 438/717 |
| 7,179,744 | B2 | * | 2/2007 | Lee et al. .................... 438/689 |
| 2004/0058517 | A1 | * | 3/2004 | Nallan et al. ................ 438/585 |
| 2004/0058533 | A1 | * | 3/2004 | Sakai et al. .................. 438/689 |

FOREIGN PATENT DOCUMENTS

| JP | 358113375 | 7/1983 |
|---|---|---|
| JP | 04-29349 | 1/1992 |

(Continued)

*Primary Examiner*—Thao P. Le
(74) *Attorney, Agent, or Firm*—Volentine & Whitt, P.L.L.C.

(57) ABSTRACT

In a method of manufacturing a semiconductor device, a dummy sample and an actual device are prepared. The dummy sample and the actual device have substantially an identical layer and an identical resist pattern formed on the layer. Then, a dummy discharge is carried out. The layer and the resist pattern of the dummy sample are etched in an etching device so that the layer and the resist pattern of the dummy device are simultaneously slimmed. Finally, the layer and the resist pattern of the actual device are etched in the etching device after the etching of the dummy sample so that the layer and the resist pattern of the actual device are simultaneously slimmed.

6 Claims, 7 Drawing Sheets

FOREIGN PATENT DOCUMENTS

| | | |
|---|---|---|
| JP | 05-074739 | 3/1993 |
| JP | 05-144779 | 6/1993 |
| JP | 06-005564 | 1/1994 |
| JP | 06-084851 | 3/1994 |
| JP | 10-012598 | 1/1998 |
| JP | 2000-058830 | 2/2000 |
| JP | 2000-323452 | 11/2000 |

* cited by examiner

ETCHING METHOD, GATE ETCHING METHOD, AND METHOD OF MANUFACTURING SEMICONDUCTOR DEVICES

This is a divisional application of application Ser. No. 10/364,356, filed Feb. 12, 2003, now U.S. Pat. No. 6,849,556, which is hereby incorporated by reference in its entirety for all purposes, and which claims priority under 35 U.S.C. 119 to Japanese priority application 282155/2002.

BACKGROUND OF THE INVENTION

1. Field of the Invention

The present invention relates to a manufacturing process of semiconductor devices, and more specifically to an etching method, a gate etching method, and a method of manufacturing a semiconductor device.

2. Description of the Related Art

The demands for higher-speed and power saving semiconductor devices are promoting finer design rules of semiconductor devices. Dimensional control values for each step have been often set approximately at actual dimensions ±10% heretofore. However, as the design rules become finer remarkably, required manufacturing accuracies become stricter.

Particularly to a gate manufacturing step, especially strict requests have been made because the accuracies in the gate manufacturing step are linked to the performance of transistors and consequently associated with the ability of all the LSIs to a large extent. The gate size of a device, which has been developed heretofore, is approximately 50-100 nm. Considering a control range of the gate to be ±10%, a dimensional control value is expressed as ±5-10 nm. The higher the accuracy is, the better the accuracy is, of course.

Further, it is difficult to achieve currently required dimensions only by the lithography. Accordingly, techniques of slimming (reducing in width) a resist pattern by plasma etching before processing a gate material are commonly adopted. The techniques can be roughly classified as methods by which only a resist is slimmed; or methods by which a resist and a resist-underlying films, i.e. an organic film located under the resist, are slimmed simultaneously. In a method of slimming only a resist, a conventional ashing apparatus is utilized to carry out isotropic etching using oxygen ($O_2$) plasma. However, the method has difficulty in addressing a thinner resist because the resist is etched not only from the side but also from above. Therefore, a method of simultaneously slimming a resist and an organic film located under the resist mainly has been often used as disclosed in Japanese unexamined published patent application JP-A-09-237777.

In general, it is a custom in many etching processes to carry out dummy discharge using a Si-substrate before plasma etching to improve the reproducibility and stability of the processes. Further, depending on a plasma etching system, cleaning discharge for cleaning within the etching system for each etching process can be performed.

Because a gate-slimming step by plasma etching is an important step influencing device characteristics, both the cleaning discharge and dummy discharge using a Si-substrate are often carried out.

It is also proposed to etch a dummy wafer, which has the same characteristics as those of a semiconductor wafer to be etched, by plasma etching in order to ensure stable states of etching characteristics immediately after cleaning discharge, as disclosed in Japanese unexamined published patent application JP-A-06-084851.

However, it has been understood that only the cleaning discharge and the dummy discharge using a Si-substrate can not address the requirements for dimensional accuracies, which are becoming increasingly stricter, because of difficulties in reproducibility and stability thereof in the case of using the foregoing method of slimming process.

Figure 7:
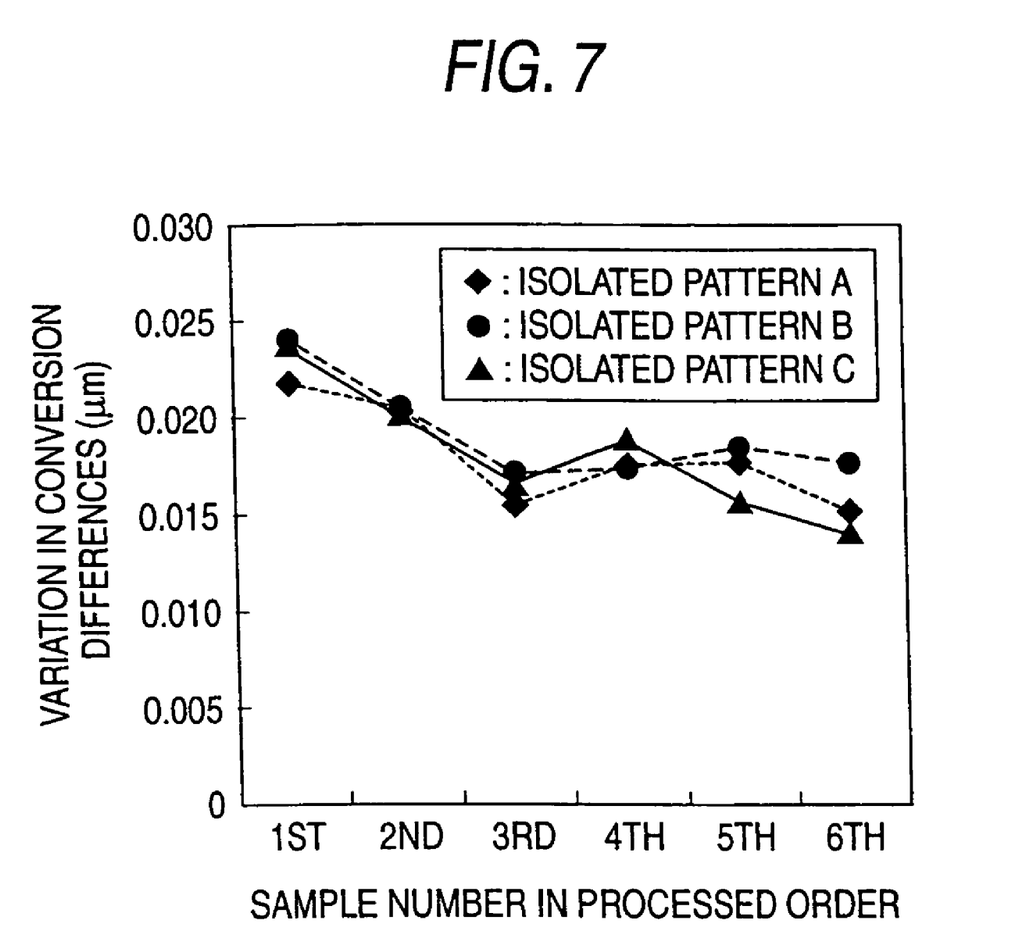
FIG. 7 is a graph for explaining problems in the related art.

FIG. 7 is a graph for explaining problems in the related art, in which three arbitrary isolated patterns are indicated by measurement points A, B, and C, and the horizontal and vertical axes represent numbers of the processing order and conversion differences (equal to a lithographic size minus an etching size) respectively.

The conversion difference is a sum-of dimensional differences when slimming a resist-underlying film and when processing a gate material under the resist-underlying film. The presence of variations in the conversion difference means that conversion differences in etching change actual sizes widely even if lithographic sizes are precisely equivalent.

As a result, a dimensional accuracy becomes lower and variations in gate size arise even in the same lot, whereby the characteristics of transistors widely change from wafer to wafer.

Further, in the case where discharge is carried out using a dummy wafer having the same characteristics as those of a wafer to be etched, it is utilized that depositing reaction products, which are composed of the same components as those of a wafer to be etched, on the inside of an etching system causes etching characteristics to be moved into stable regions thereof.

In this case, it is necessary to remove only reaction products of a resist as contaminations by carrying out plasma cleaning because reaction products of the resist are deposited on the inside of the etching system when the dummy wafer has a resist pattern formed thereon.

SUMMARY OF THE INVENTION

In a method of manufacturing a semiconductor device of the present invention, a dummy sample and an actual device are prepared. The dummy sample and the actual device have substantially an identical layer and an identical resist pattern formed on the layer. Then, a dummy discharge is carried out. The layer and the resist pattern of the dummy sample are etched in an etching device so that the layer and the resist pattern of the dummy device are simultaneously slimmed. Finally, the layer and the resist pattern of the actual device are etched in the etching device after the etching of the dummy sample so that the layer and the resist pattern of the actual device are simultaneously slimmed.

DESCRIPTION OF PREFERRED EMBODIMENTS OF THE INVENTION

Figure 1:
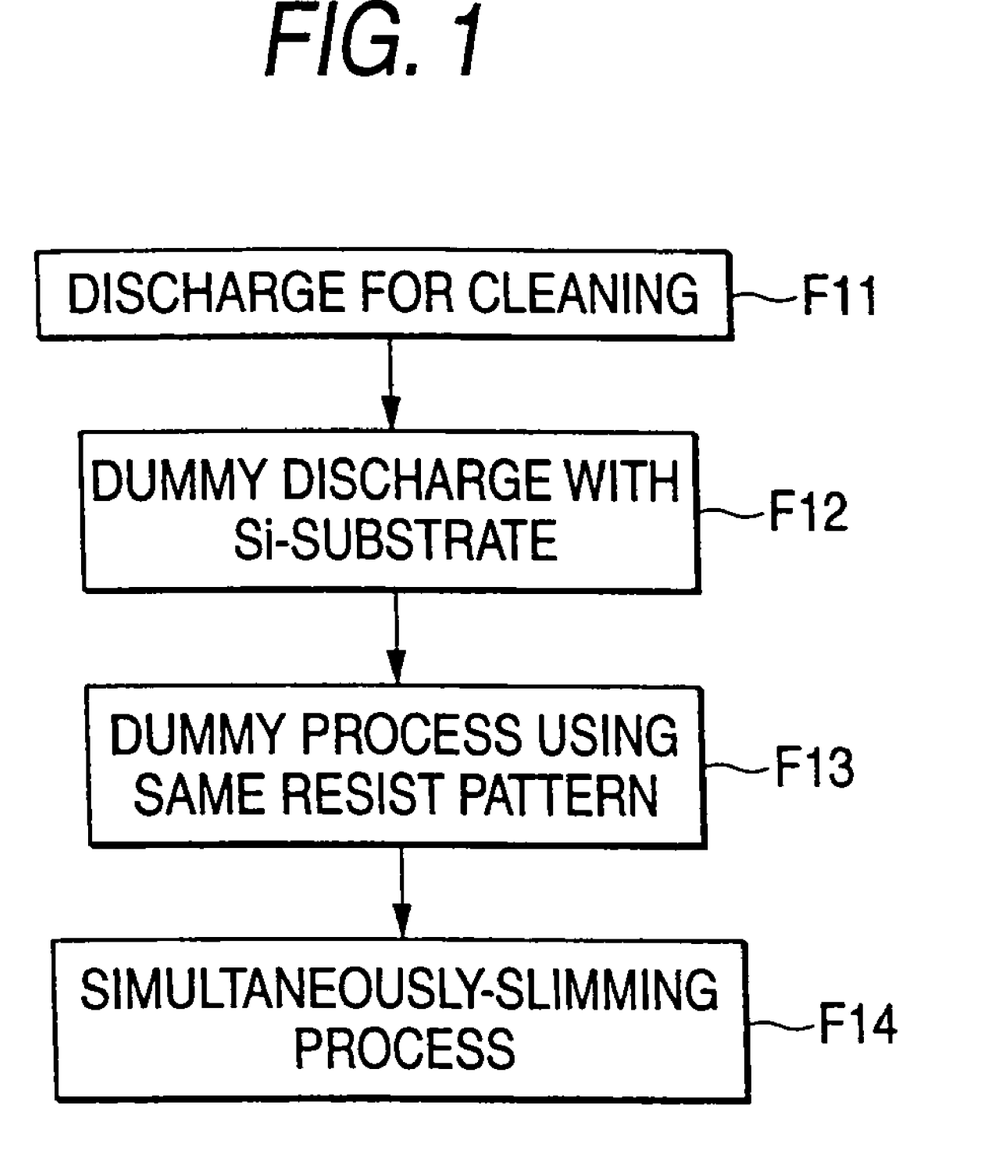
FIG. 1 is a flowchart showing a first embodiment of the invention.

The embodiments of the invention will be described with reference to the accompanying drawings. FIG. 1 is a flowchart showing a first embodiment of the invention.

In Flow F11, cleaning discharge for cleaning an atmosphere within a plasma etching system is carried out as in the case of the related art. For example, in the case where an organic film is deposited on an inner wall of the system and the like, an oxygen gas having a tendency to remove organic films is introduced to induce discharge and thereby to remove the organic film.

In Flow F12, dummy discharge for making the atmosphere within the etching system the same as that in another etching step to be performed thereafter is carried out as in the case of the related art.

In other words, plasma etching is carried out by inducing discharge under the same conditions as a later etching conditions using a semiconductor substrate such as a Si-substrate.

More specifically, the plasma etching is carried out by loading a Si-substrate into the system, introducing an etching gas, applying across electrodes with an RF power, and inducing discharge.

In Flow F13, a dummy process, in which a resist pattern and a resist-underlying film simultaneously undergo a slimming process by plasma etching, is carried out using a dummy sample having the same structure, i.e. same layered structure, and the same resist pattern as those of an actual device.

The resist-underlying film is an organic film underlying the resist pattern as in the case of the related art. Further, a technique for performing a simultaneously-slimming process in itself has been known conventionally.

More specifically, the plasma etching is isotropically carried out by loading a dummy sample into the system, introducing an etching gas, and inducing discharge.

In Flow F14, on a semiconductor wafer having a resist pattern for an actual device formed thereon, the resist pattern and resist-underlying film are simultaneously subjected to a slimming process by plasma etching. Namely, what is called a regular process is carried out in this step.

It is important here to carry out the dummy process using a dummy sample with a resist pattern before performing a regular simultaneously-slimming process.

The dummy process conditions are the same as those of the regular slimming process to be carried out later.

It is also important to use a sample having a resist pattern as a dummy sample, in which the presence of a resist region is a requirement.

In a conventional case, the reaction products of a resist are removed as contaminations because of utilizing the reaction products of an etched film. On the other hand, the invention utilizes the reaction products of a resist positively. More specifically, the invention ensures the improvements of the stability of etching characteristics and dimensional accuracies by causing a deposition film, which is made of a resist having high reactivity to an etching gas such as oxygen in the dummy process, to be deposited stably on an inner wall of the system.

Figure 2:
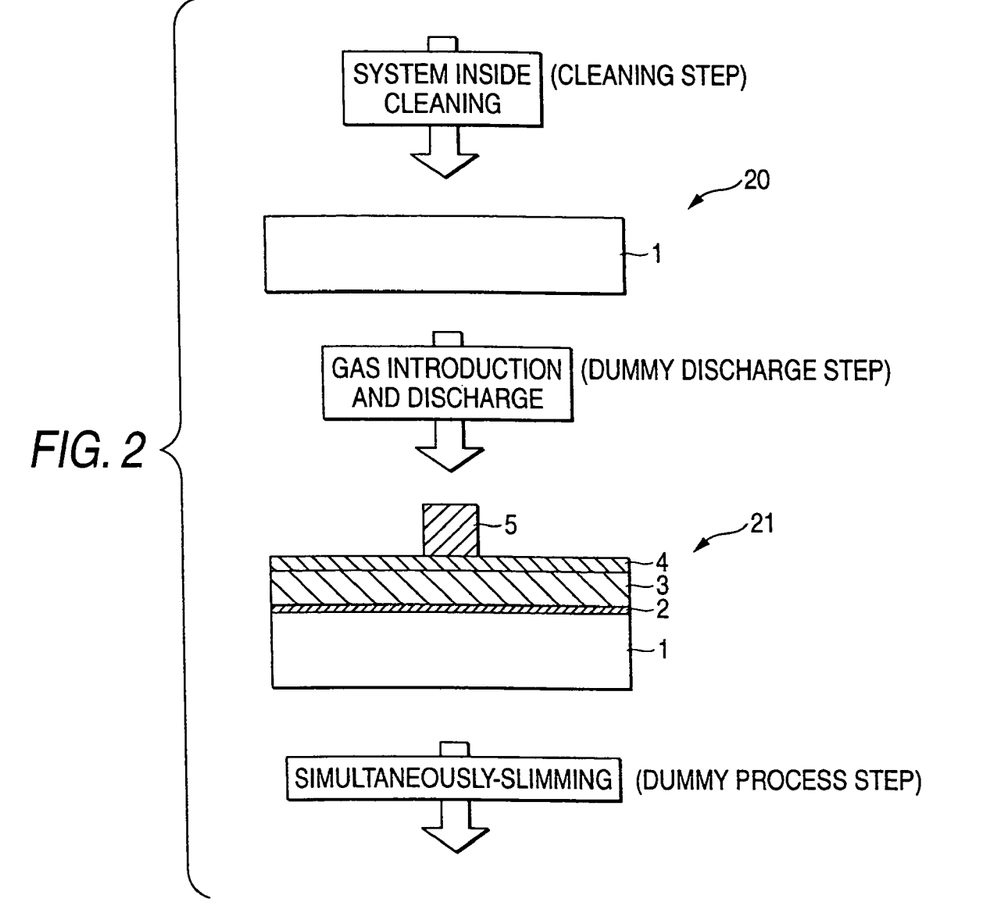
FIG. 2 is a view showing the manufacturing steps of the first embodiment.
Figure 3:
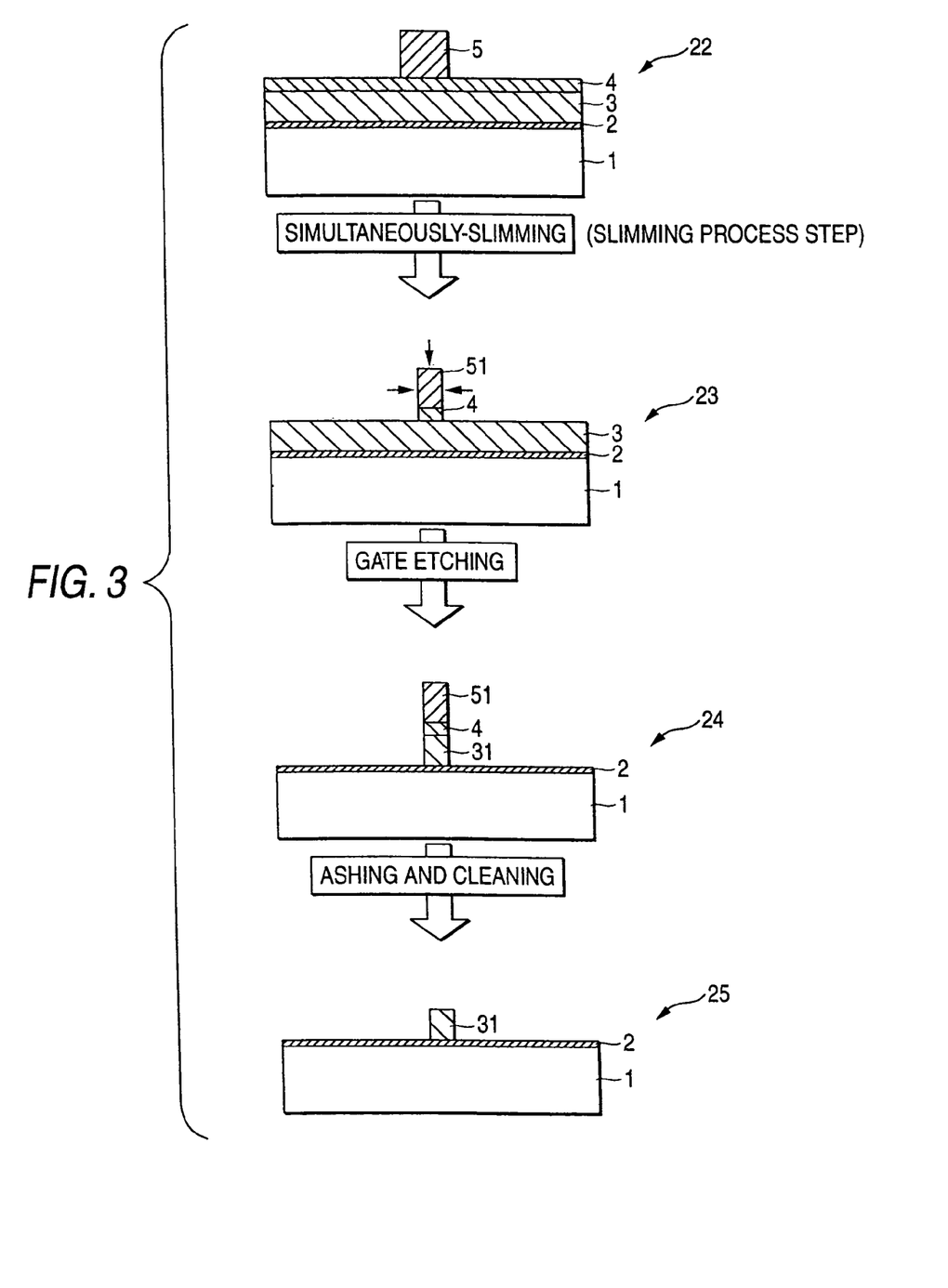
FIG. 3 is a view showing the manufacturing steps of the first embodiment.

Referring now to FIGS. 2 and 3, both are views showing the steps in the first embodiment. The drawings illustrate an example where the first embodiment is applied to a gate process.

First, as shown in FIG. 2, a cleaning step is carried out for cleaning the inside of the plasma etching system by the cleaning discharge in Flow F11 of FIG. 1.

Second, a Si-substrate indicated by the numeral 20 is carried into the system, followed by introducing oxygen into the system, as described in Flow F12, to carry out the dummy discharge for causing the gas to discharge. After that, the Si-substrate is unloaded out of the system.

The numeral 21 indicates a cross section of a dummy sample having the same structure as that of an actual device. The dummy sample is formed as having a gate insulating film 2 over a Si-substrate 1, a gate material 3 of polysilicon (poly-Si) on the gate insulating film, a resist-underlying film 4 of an organic film on the poly-Si layer, and a resist pattern 5 on the resist-underlying film.

The dummy sample is carried into the system, and the simultaneously-slimming process in Flow F13 is carried out on the resist pattern 5 and the resist-underlying film 4 by plasma etching in the dummy process. The dummy sample is thereafter unloaded out of the system.

The numeral 22 in FIG. 3 indicates a cross section of a semiconductor wafer having a resist pattern for an actual device formed thereon, and the same structure as that of the dummy sample. The semiconductor wafer is carried into the system, and subjected to the simultaneously-slimming process of the resist pattern 5 and the resist-underlying film 4 through plasma etching.

After the slimming step, as indicated by the numeral 23, the resist pattern 5 is subjected to a slimming process isotropically by plasma etching to provide a resist pattern 51.

In addition, the resist-underlying film 4 under the resist pattern 51 is narrowed in width and exposed portions of the resist-underlying film 4 are removed.

After that, the gate material 3 is subjected to gate etching by the known plasma etching using the resist pattern 51 as a mask, whereby a gate 31 is formed as indicated by the numeral 24. In ashing and cleaning steps, the remaining resist pattern 51 and resist-underlying film 4 are removed to provide the gate 31 in the form indicated by the numeral 25.

Figure 4:
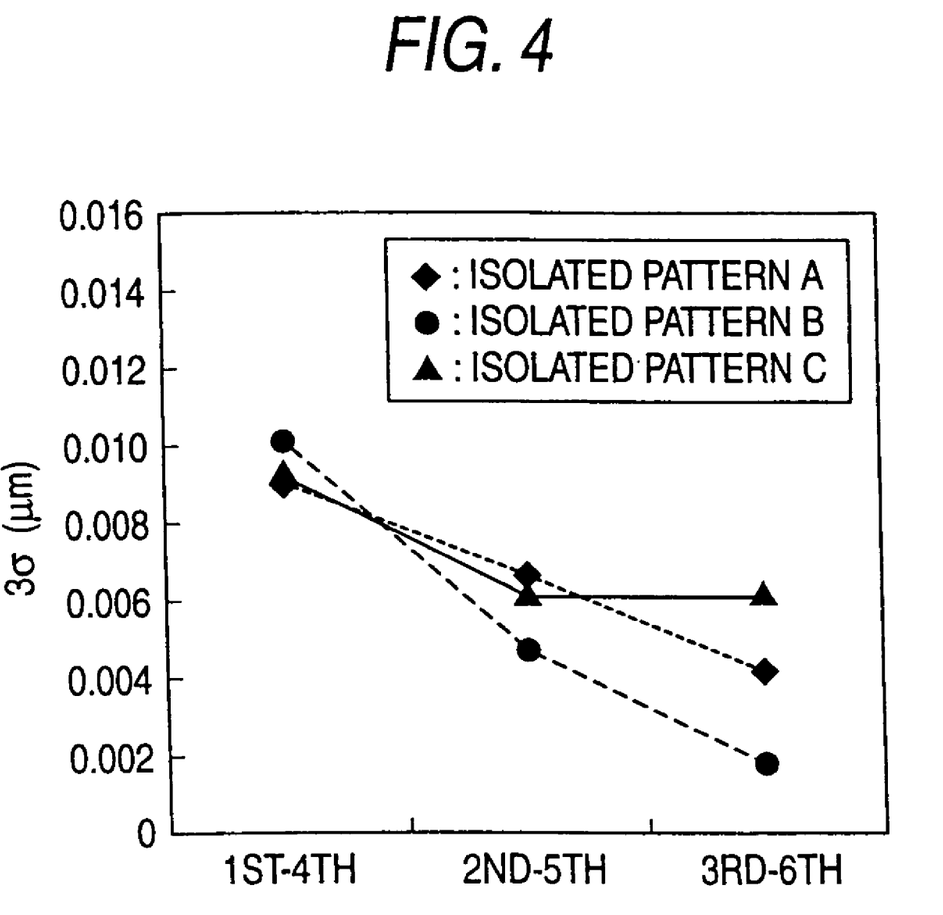
FIG. 4 is a graph showing variations in conversion difference.

Referring now to FIG. 4, variations in conversion difference are shown expressed by 3σ. In the drawing, measurement points A, B, and C are three arbitrary isolated patterns, and horizontal and vertical axes represent the number of processed samples and the value of 3σ, respectively.

The data of first to fourth samples on the horizontal axis are equivalent to the data before introducing the dummy process as in the case of the related art. The values of 3σ at the individual measurement points are in the range of 9-10 nm.

The data of second to fifth samples indicate the data in the case of introducing the dummy process for one sample. The values of 3σ at the individual measurement points are in the range of 4-6 nm. Further, the data of third to sixth samples represent the data in the case of introducing the dummy process for two samples. The values of 3σ at the individual measurement points are in the range of 2-6 nm.

Therefore, it is understood that the values of 3σ in the case of introducing the dummy process for one to two samples are reduced to about one-half of the values in the case before introducing the dummy process.

In general, the plasma gate-etching step using a slimming technique is roughly divided into the steps of: slimming an organic film, i.e. a resist-underlying film; and etching a gate material. In the gate manufacturing step, which requires extremely precise processing, a method of detecting an end of the etching with light emission intensities is commonly used. The final detection time thereof can be a kind of monitoring means, by which an etching situation can be observed in real time.

Accordingly, monitoring changes in detected time from time to time enables the observation of changes in etching condition. The detection times in the individual steps are listed in Table 1.

TABLE 1

| | | End-of-etching detection time (Si dummy: Used) | | End-of-etching detection time (Si dummy: Not used) | |
|---|---|---|---|---|---|
| | Procedural steps | Underlying film etching | Gate material etching | Underlying film etching | Gate material etching |
| 1 | discharge for cleaning | done | done | done | done |
| 2 | Si dummy discharge | done | done | not done | not done |
| 3 | Slimming 1st sample | 17 sec | 73 sec | 17 sec | 75 sec |
| 4 | 2nd sample | 17 sec | 71 sec | 17 sec | 71 sec |
| 5 | 3rd sample | 17 sec | 71 sec | 17 sec | 71 sec |
| 6 | 4th sample | 17 sec | 71 sec | — | — |
| 7 | 5th sample | 17 sec | 71 sec | — | — |
| 8 | 6th sample | 17 sec | 71 sec | — | — |

The detection times are constant in the step of slimming an organic film by plasma etching, whereas the detection times in the step of etching a gate material with plasma do not become stable until a second sample.

The change in end-of-etching detection time in the case of not performing the Si dummy discharge are also listed in the table. The end-of-etching detection times in the case of etching an organic film are fixed at 17 sec, whereas the detection times in the step of etching a gate material reach 75 sec for the first sample and 71 sec for second and later samples.

From the above data, a normal value of a time for etching a gate material is expected to be 71 seconds. To make the gate material etching time closer to the normal value, it is important to carry out the slimming process using a dummy sample having a resist pattern as a first sample. This is exceedingly effective to make the process stable.

As stated above, according to the first embodiment, carrying out the dummy process using a dummy sample with a resist pattern can reduce variations in conversion difference in plasma etching and therefore reduce variations in size to ensure the improvement of dimensional accuracies.

Figure 5:
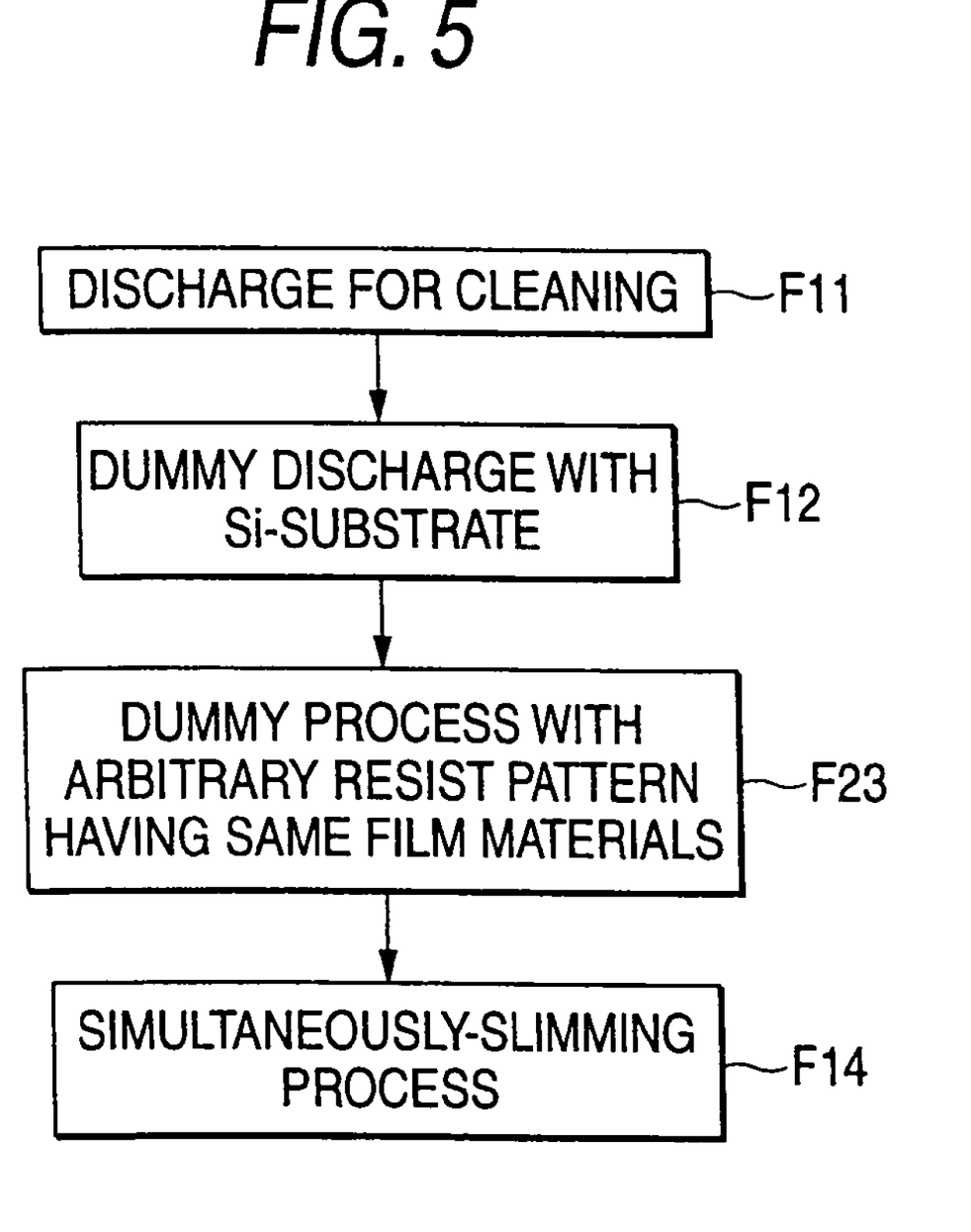
FIG. 5 is a flowchart showing a second embodiment of the invention.

FIG. 5 is a flowchart showing a second embodiment of the invention.

The second embodiment is the same as the first embodiment illustrated in FIG. 1 except Flow F23, and hence only Flow F23 is described and the rest are omitted.

A dummy sample used in Flow F23 has an etched film of the same material as the one that an actual device has, and an arbitrary resist pattern.

The etched film refers to all the films etched in the etching step such as a gate material, a gate insulating film, and an anti-reflection film.

Using the dummy sample, a dummy process, by which the resist pattern and the resist-underlying film are slimmed simultaneously, is carried out.

In general, gate structures vary from device to device to no small extent. The dissimilarities are film thicknesses, impurity implantation densities, materials, etc. Of course, devices differ in mask used therefor, the presence or absence of an anti-reflection film, resist pattern density and thickness, etc.

However, if only making a dummy sample identical in film composition, i.e. materials of etched films, to an actual device, carrying out the dummy process enables the variations in gate size to be reduced even when the film thicknesses and impurity doses of gate materials as well as resist patterns vary from device to device.

For example, in the case of a certain device of single-layer structure with a 150 nm-thick poly-Si film, which has been implanted with impurities at a density of about $1e15/cm^3$, a single-layer structure having a 200 nm-thick poly-Si film implanted with no impurities may be used as a dummy sample. In this case, the time involved in producing a dummy sample can be reduced because of no implantation. When there is an anti-reflection film, such as organic BARC and SiON, it is required to make the dummy sample identical in the material to the device.

As stated above, according to the second embodiment, an arbitrary resist pattern may be used in addition to the advantages of the first embodiment, which eliminates the need for using different dummy samples from device to device. Consequently, producing dummy samples patterned with one mask can serve the purpose, so that the advantage of simplifying the production of dummy samples can be obtained.

Figure 6:
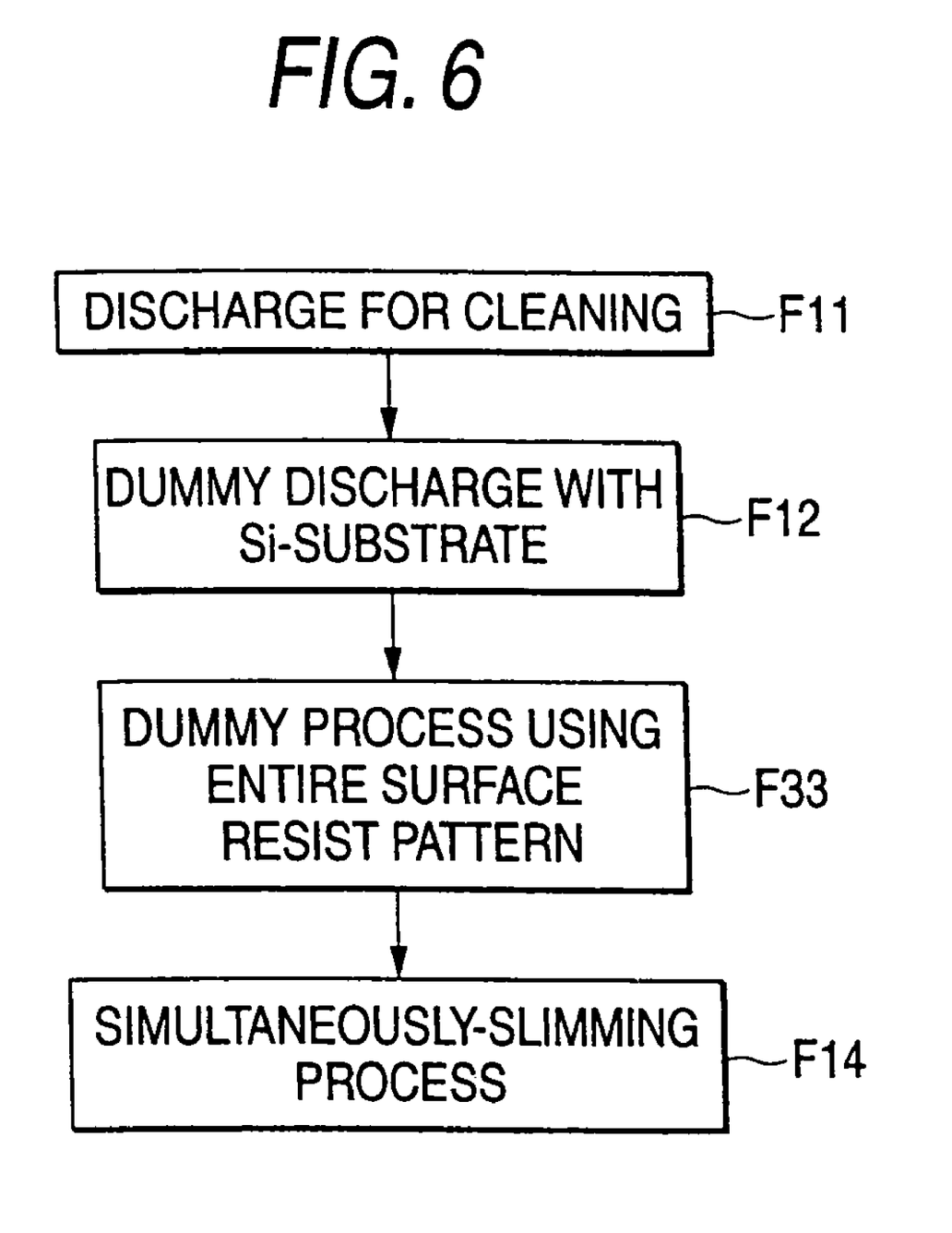
FIG. 6 is a flowchart showing a third embodiment of the invention.

FIG. 6 is a flowchart showing the third embodiment of the invention.

The third embodiment is the same as the first embodiment illustrated in FIG. 1 except Flow F33, and hence only Flow F33 is described and the rest are omitted.

A dummy sample to be used in Flow F33 has been coated with a resist. In other words, the dummy sample has a resist pattern over the whole surface.

Using the dummy sample, a dummy process, in which etching is conducted under the same conditions as those of the slimming process, is carried out.

As described on the first embodiment, in the case where the dummy sample has a resist region, a deposition film formed from an etching gas and the resist is deposited on the inner wall of the system stably. Therefore, there is no problem even with a resist pattern on the entire surface. Further, if anything, patterning is not required, which will contribute to the simplification of steps correspondingly.

As stated above, according to the third embodiment, a dummy sample with an entire surface resist pattern enables the reuse of the dummy sample in addition to the advantages of the second embodiment, although it is impossible to reproduce a dummy sample because a gate pattern is transferred through the dummy process in the first and second embodiments.

Now, a fourth embodiment of the invention will be described.

In general, corrosive gases, such as $Cl_2$ and HBr, are often used to process poly-Si, WSi, and the like, which are frequently used as a gate material.

Although a discharging gas for etching has not been specified in the third embodiment, the etching conditions are set so that a discharging gas used in the step of the dummy process includes no corrosive gases such as $Cl_2$ and HBr in the fourth embodiment.

For example, necessary conditions in the case of a poly-Si gate ($HBr/O_2$=100/3 sccm; 8 mTorr; TopRF=250 W; and BottomRF=30 W) may be replaced with improvement conditions ($He/CF_4$=100/20 sccm; 15 mTorr; TopRF=250 W; and BottomRF=30 W).

Thus setting the condition of including no corrosive gases as a process condition for the step of the dummy process prevents a resist coated over the whole surface thereof from taking in corrosive gases, so that the corrosion of a transfer chamber and a load-lock chamber can be minimized.

As stated above, according to the fourth embodiment, the corrosion of components within a plasma etching system can be suppressed in addition to the advantages of the third embodiment, thereby increasing the lifetime of the system. Further, the fourth embodiment of the invention is useful in view of the environments because the corrosive gas does not escape into the atmosphere.

As stated above, according to the invention, a dummy sample having a resist region is subjected to the dummy process, so that variations in size in the etching process can be reduced to ensure the improvement of dimensional accuracies.

What is claimed is:

1. A method of manufacturing a semiconductor device comprising:

preparing a dummy sample and an actual device each of which has a layer and a resist pattern formed on the layer, wherein each of the layers and the resist patterns of the dummy sample and the actual device have substantially identical material, but have a different size;

carrying out a dummy discharge;

etching the layer and the resist pattern of the dummy sample in an etching device, so as to simultaneously slim the layer and the resist pattern of the dummy sample; and etching the layer and the resist pattern of the actual device in the etching device after the etching of the dummy sample, so as to simultaneously slim the layer and the resist pattern of the actual device.

2. A method of manufacturing a semiconductor device according to claim 1, wherein the dummy discharge includes:

providing a silicon substrate in the etching device;

introducing an etching gas into the etching device; and applying an RF power to the etching device so as to etch the silicon substrate.

3. A method of manufacturing a semiconductor device according to claim 1, wherein conditions of the dummy sample etching and the actual device etching are substantially identical.

4. A method of manufacturing a semiconductor device according to claim 1, wherein conditions of the dummy discharge, the dummy sample etching and the actual device etching are substantially identical.

5. A method of manufacturing a semiconductor device according to claim 1, wherein a deposition film made of a material of the resist pattern is deposited on an inner wall of the etching device.

6. A method of manufacturing a semiconductor device according to claim 1, wherein the dummy sample includes a gate insulating film formed on a substrate, a gate material film formed on the gate insulating film, an organic layer formed on the gate material film, and the resist pattern formed on the organic layer, and wherein the actual device includes the gate insulating film formed on the substrate, the gate material film formed on the gate insulating film, the organic layer formed on the gate material film, and the resist pattern formed on the organic layer.

* * * * *